(12) United States Patent
Hama et al.

(10) Patent No.: US 6,930,891 B1
(45) Date of Patent: Aug. 16, 2005

(54) ELECTROMAGNETIC SHIELDING PLATE, ELECTROMAGNETIC SHIELDING STRUCTURE, AND ENTERTAINMENT SYSTEM

(75) Inventors: Toshikatsu Hama, Tokyo (JP); Osamu Murasawa, Tokyo (JP)

(73) Assignee: Sony Computer Entertainment Inc., Toyko (JP)

( * ) Notice: Subject to any disclaimer, the term of this patent is extended or adjusted under 35 U.S.C. 154(b) by 0 days.

(21) Appl. No.: 09/658,198

(22) Filed: Sep. 8, 2000

(30) Foreign Application Priority Data

Sep. 10, 1999 (JP) ................................ 11-257791

(51) Int. Cl.[7] .............................................. H05K 7/18
(52) U.S. Cl. .................... 361/800; 361/753; 174/35 R; 174/51
(58) Field of Search ........................ 361/800, 816–818, 361/736, 737, 752, 753, 799; 174/35 R, 51; 439/607–610

(56) References Cited

U.S. PATENT DOCUMENTS

| | | | |
|---|---|---|---|
| 4,754,101 A * | 6/1988 | Stickney et al. | 174/35 R |
| 5,014,160 A * | 5/1991 | McCoy, Jr. | 361/818 |
| 5,365,410 A * | 11/1994 | Lonka | 361/816 |
| 5,373,101 A | 12/1994 | Barabolak | |
| 5,748,455 A * | 5/1998 | Phillips et al. | 361/818 |
| 6,049,469 A * | 4/2000 | Hood, III et al. | 361/818 |
| 6,180,045 B1 * | 1/2001 | Brandenburg et al. | 264/263 |
| 6,188,578 B1 * | 2/2001 | Lin et al. | 361/717 |
| 6,239,359 B1 * | 5/2001 | Lilienthal, II et al. | 174/35 GC |
| 6,265,659 B1 * | 7/2001 | Kaiser | 174/52.1 |
| 6,288,330 B1 * | 9/2001 | Chen | 174/35 R |
| 6,297,967 B1 * | 10/2001 | Davidson et al. | 361/800 |
| 6,320,121 B1 * | 11/2001 | Honeycutt et al. | 174/35 R |
| 6,330,167 B1 * | 12/2001 | Kobayashi | 361/818 |

FOREIGN PATENT DOCUMENTS

| | | |
|---|---|---|
| EP | 0 755 177 A1 | 1/1997 |
| JP | 63-10597 | 1/1988 |
| JP | 63-153598 | 10/1988 |
| JP | 6-72296 | 10/1994 |
| JP | 9-186481 | 7/1997 |
| JP | 10-41668 | 2/1998 |
| JP | 11-30961 | 2/1999 |
| TW | 85207472 | 5/1985 |
| TW | 305518 | 5/1997 |
| WO | WO 94/27421 | 11/1994 |

* cited by examiner

*Primary Examiner*—Kamand Cuneo
*Assistant Examiner*—Thanh S. Phan
(74) *Attorney, Agent, or Firm*—Katten Muchin Zavis Rosenman

(57) ABSTRACT

An electromagnetic shielding plate having high shielding effect is provided.

The electromagnetic shielding plate is formed of a conductive plate having elasticity and is provided on the edge thereof with a connecting strip bent in such a manner that the tip thereof projects from the surface of the plate, and with a supporting portion. When the electromagnetic shielding plate and the printed substrate are connected, it is ensured that the ground pattern 201 of the printed board 200 and the connecting strip are brought into contact with respect to each other, thereby a high shielding effect can be obtained.

29 Claims, 7 Drawing Sheets

ELECTROMAGNETIC SHIELDING PLATE, ELECTROMAGNETIC SHIELDING STRUCTURE, AND ENTERTAINMENT SYSTEM

This invention claims a priority based on Japanese Patent Application No. 11-257791 filed on Sep. 10, 1999, the entire contents of which are incorporated herein by reference for all purposes.

BACKGROUND OF THE INVENTION

The present invention relates to an electromagnetic shielding plate, an electromagnetic shielding structure, and an entertainment system having the electromagnetic shielding structure.

In electronic equipment, there are cases where electromagnetic waves are generated resulting from actions of internal equipment and are radiated out to the exterior of equipment. In recent years, it is strongly desired to minimize radiation of unnecessary electromagnetic wave in terms of electronic equipment. Therefore, in electronic equipment, shielding is carried out in such a manner that the enclosure itself is shielded, or the device mounted surface of the printed board is shielded by covering it with a box-shaped member formed of a metal.

For example, in case where the box-shaped member covers the device-mounted surface of the printed board, the structure will be as follows. As a first step, a ground pattern is printed on the circumferential portion on the printed board. On the other hand, an opening edge of the box-shaped member is turned outwardly to form a contact surface, which is then placed on the printed board. In this case, the box is located on the printed board so that the contact surface of the box comes into contact with the ground pattern mounted on the circumferential portion of the printed board. In this situation, the box-shaped member is secured on the printed board by screwing or some other means.

In such a structure, electromagnetic radiation from the device-mounted surface to the exterior of the equipment may be restrained since the device-mounted surface of the printed board is covered by the box-shaped member.

SUMMARY OF THE INVENTION

The shielding structure described above can ideally restrain electromagnetic radiation to the exterior of the electromagnetic equipment. However, in actually, there is a case where restraining effect for electromagnetic radiation is not exerted satisfactorily. In other words, product-to-product variations in performance of electromagnetic radiation are found. According to the analysis carried out by the inventor of the present invention, it was found that such variations are caused by insufficient contact between the contact surface of the box-shaped member and the ground pattern. In other words, there may be a warp or waviness in the printed board, thereby generating projections and depressions on the ground pattern. Since the contact face of the box-shaped member cannot follow such a warp or waviness, a gap is created between the contact face and the ground pattern, through which electromagnetic wave may be radiated. Consequently, sufficient shielding is not performed.

It is possible to stop up the gap between the contact surface of the box shaped member and the ground pattern by means of soldering, whereby the gap may be closed almost completely. As a consequent, product-to-product variations in shielding performance may be prevented.

However, in this method, it is necessary to solder all around the circumference of the printed board. Therefore, "soldering" step is added to the manufacturing process. The added soldering step has a problem in that it takes time to carry out. Therefore, it is not practical to stop up the gap by soldering, except for special costly products. Therefore, this method is not generally employed.

Accordingly, the first object of the present invention is to provide a shielding plate that does not require special mounting step, is easy to mount, and can prevent radiation of electromagnetic wave independently of the state of the object to which it is mounted.

The second object of the present invention is to provide a shielding structure exhibiting a smaller range of product-to-product variations in shielding performance, and an entertainment system that can prevent radiation of electromagnetic wave by such a shielding structure.

An electromagnetic shielding plate achieving the first object of the invention is an electromagnetic shielding plate for shielding electromagnetic wave by covering at least a part of an object comprising; a covering plate formed of a conductive plate, and a plurality of connecting strips provided along the edge of the covering plate, wherein the connecting strip is bent so that the tip portion thereof projects from the surface of the covering plate.

The electromagnetic shielding plate for achieving the second object of the invention comprises an object on which a circuit element is mounted, an electromagnet shielding plate for shielding electromagnetic radiation by covering at least a part of the object, the object including a band-shaped ground pattern surrounding an area on which electromagnetic shielding is to be provided on a surface where the circuit element is mounted, the electromagnetic shielding plate including a covering plate formed of a conductive plate and a plurality of connecting strips provided along the edge of the covering plate, the connecting strip being bent so that the tip portion thereof projects from the surface of the covering plate, wherein the electromagnetic shielding plate and the object is kept in a positional relationship wherein the tips of the connecting strip are brought into press contact with the ground pattern.

DESCRIPTION OF THE PREFERRED EMBODIMENTS

Figure 1:
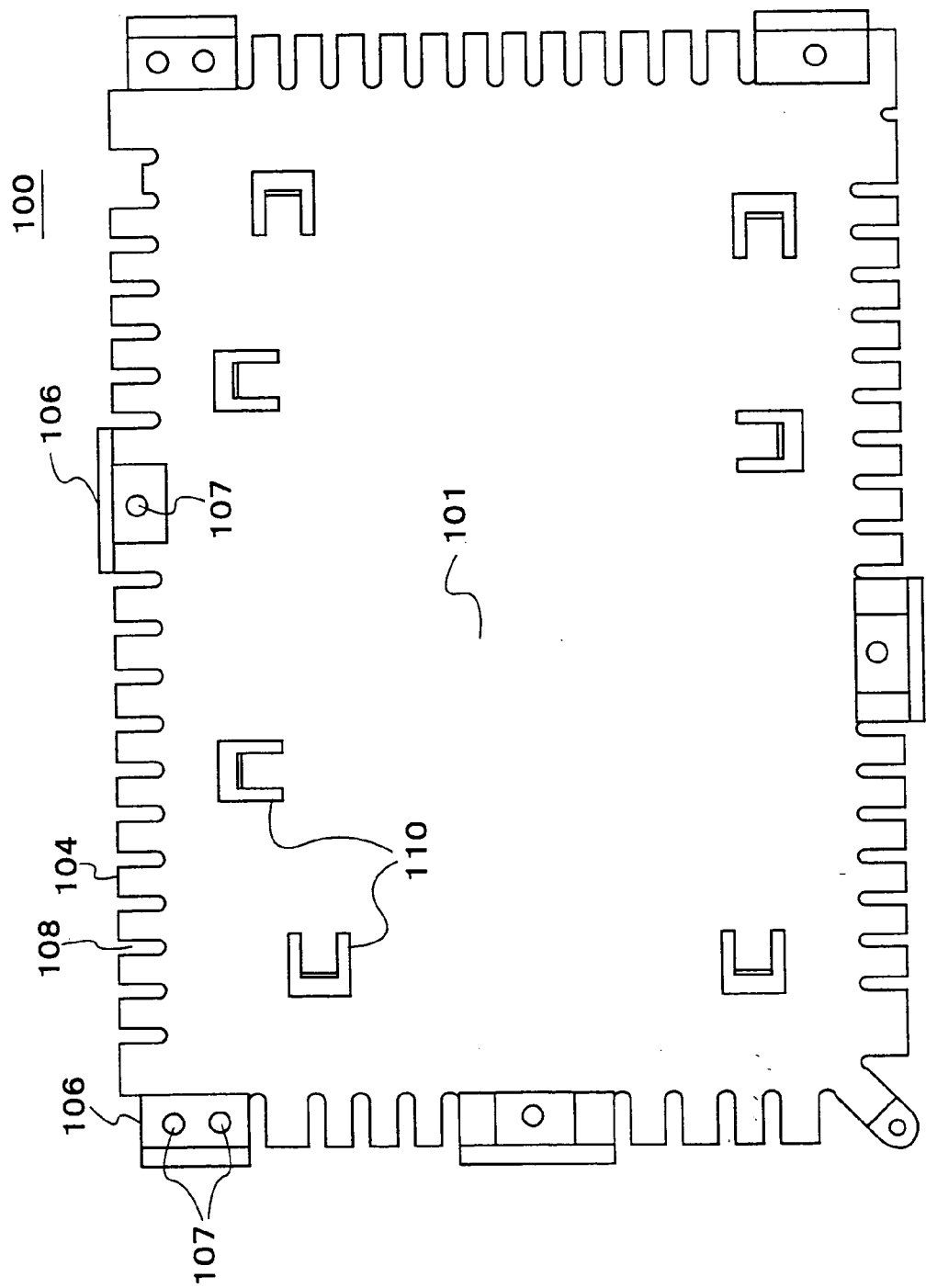
FIG. 1 is a top view of an electromagnetic shielding plate according to the first embodiment of the present invention.

Referring to the drawings, preferred embodiments of the present invention will now be described. In the following embodiments, an entertainment system that can be used for playing games, image reproduction, sound reproduction, and communication is taken as an example. A shielding plate and a shielding structure of the present invention are not limited to the entertainment system, but they are applicable to any other electronic equipment. However, it is generally preferred that entertainment system is provided at a relatively low cost. Therefore, the shielding structure of the present invention is effective when it is applied to the entertainment system.

Figure 3:
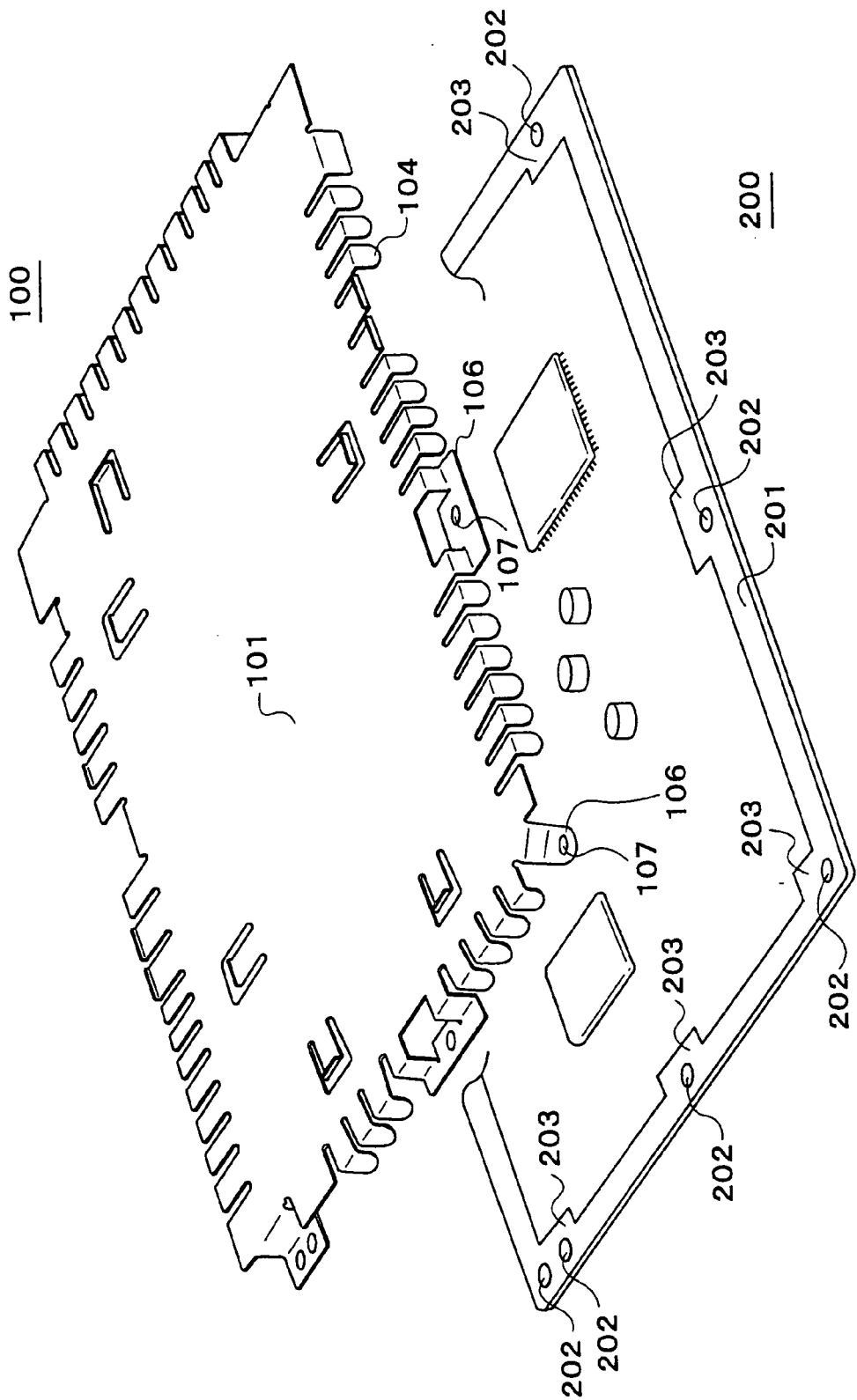
FIG. 3 is an explanatory drawing illustrating the positional relationship between the electromagnetic shielding plate and a printed board according to the first embodiment of the present invention.

The shielding structure according to the embodiment comprises, as shown in FIG. 3, a printed board 200 to which the shielding is applied, and an electromagnetic shielding plate 100 (hereinafter referred to as "shielding plate") for covering the mounting surface thereof. In the example shown in FIG. 3, the state where the shielding plate 100 is mounted to one surface of the printed board 200. This invention is not limited to this type of application. For example, the shielding plates 100 may be mounted on both the surfaces of the printed plate 200, or the shielding plate 100 may be mounted on a part of the printed board 200.

As shown in FIG. 3, one of the surfaces of the printed board 200 is provided with a ground pattern 201 in the shape of a frame. The ground pattern 201 may be mounted when providing wiring, which is not shown, on the printed board 200. In this embodiment, the ground pattern 201 is formed of copper, and provided along the circumference of the printed board 200. With this, radiation of electromagnetic wave may be retained in the area all around the printed board 200. In this embodiment, a part of the ground pattern 201, namely a portion corresponding to the four corners of the printed board 200 and midway along the length thereof, are provided with widened areas 203 respectively.

The printed board 200 is provided with through holes 202 for fixing the shielding plate at a plurality of locations. More specifically, the widened area 203 of the ground pattern 201 described above are provided with through holes 202 respectively. Fixing bolts are passed through these through holes 202 and fixed by nuts. It is also possible to cut threads on the inner surfaces of these through holes for engaging bolt with these threads.

Figure 2A:
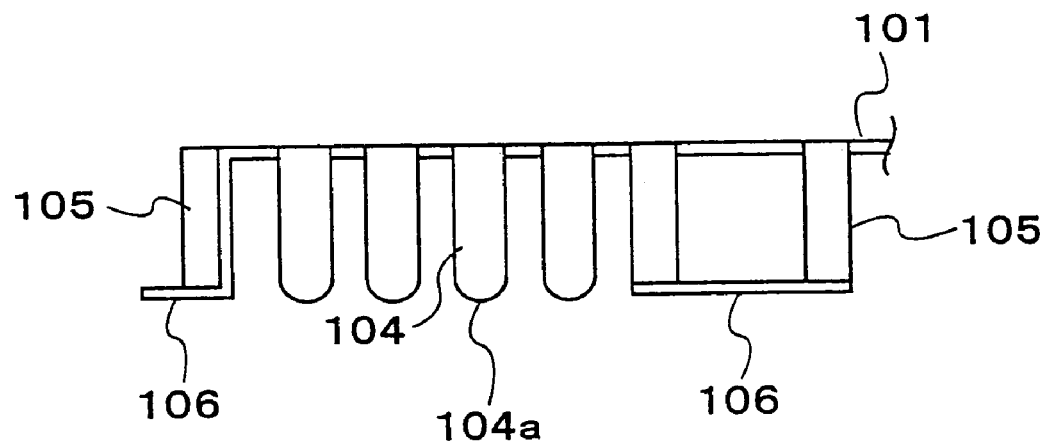
FIGS. 2A and 2B are side views of the electromagnetic shielding plate according to the first embodiment of the present invention.

Referring now to FIG. 1 and FIG. 2, there are shown a shielding plate 100 constituting the shielding structure described above. FIG. 1 is a front view of the shielding plate 100, and FIG. 2A is a side view showing a part of the shielding plate 100.

The shielding plate 100 is formed of a conductive material having elasticity. The shielding plate 100 comprises a plate portion 101, a connecting strip 104, and a supporting portion 105. The connecting strips 104 are provided at a plurality of locations along the edge of the plate portion 101. The connecting strip 104 is bent so that the tip portion thereof projects from the plate portion 101. In other words, this shielding plate 100 is formed in a box shape comprising a plate portion 101 and a side surface portion provided around the plate portion 101. The shielding plate 100 is provided with notches 108 extending from the edges of the side surface portion to a part of the plate portion 101 at a plurality of locations along the edges of the side surface portion. The connecting strips 104 are formed by these notches 108. These notches 108 reach a part of the edge of the plate portion 101, whereby each connecting strip 104 can be displaced independently.

The connecting strips 104 are brought into contact with the printed board 200 at its tip portions 104a as described later. The supporting portions 105 extend from the edge of the plate portion 101 in the same direction as the connecting strips 104. The supporting portion 105 includes a foot portion 106 on its tip portion. The foot portion 106 is composed of a plate that is almost in parallel with the plate portion 101. The foot portion 106 comprises a through hole 107.

In addition, the plate portion 101 comprises a cabinet fixing portion 110 for placing the cabinet on the shielding plate 100 and fixing the cabinet thereto.

Figure 2B:
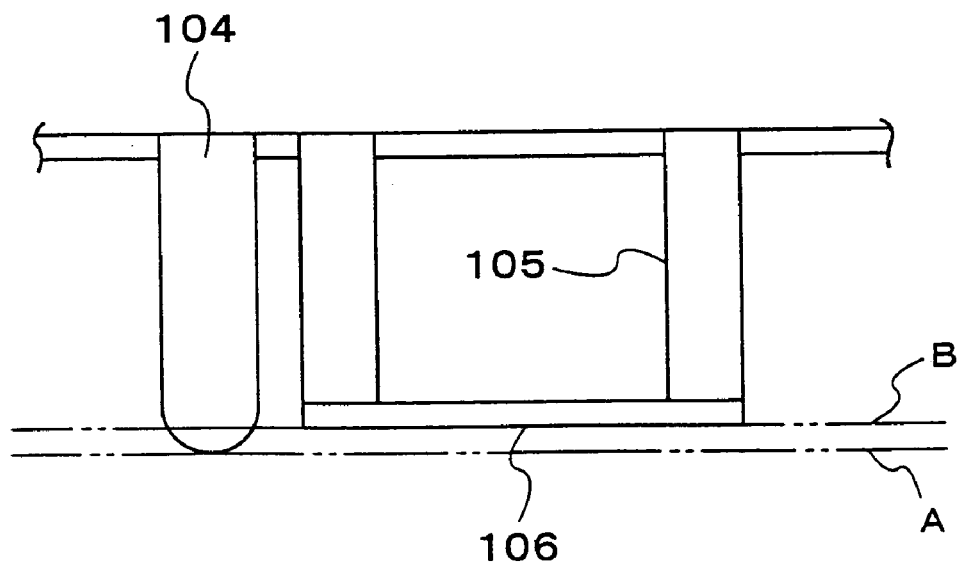

FIG. 2B is an enlarged side view showing the shielding plate 100. Now, assuming that there are an imaginary plane A in which the tip portions 104a of the connecting strips 104 are aligned and an imaginary plane B in which the tip of the supporting portions 105 are aligned. The positional relationship between the imaginary plane A and B is, as clearly be seen from the figure, the imaginary plane A is located a little outside of the imaginary plane B with respect to the plate portion 101. In other words, the projecting length of the connecting strip 104 measured to the tip thereof from the plate portion 101 is larger than that of the supporting portion 105 from the plate portion 101.

Figure 4A:
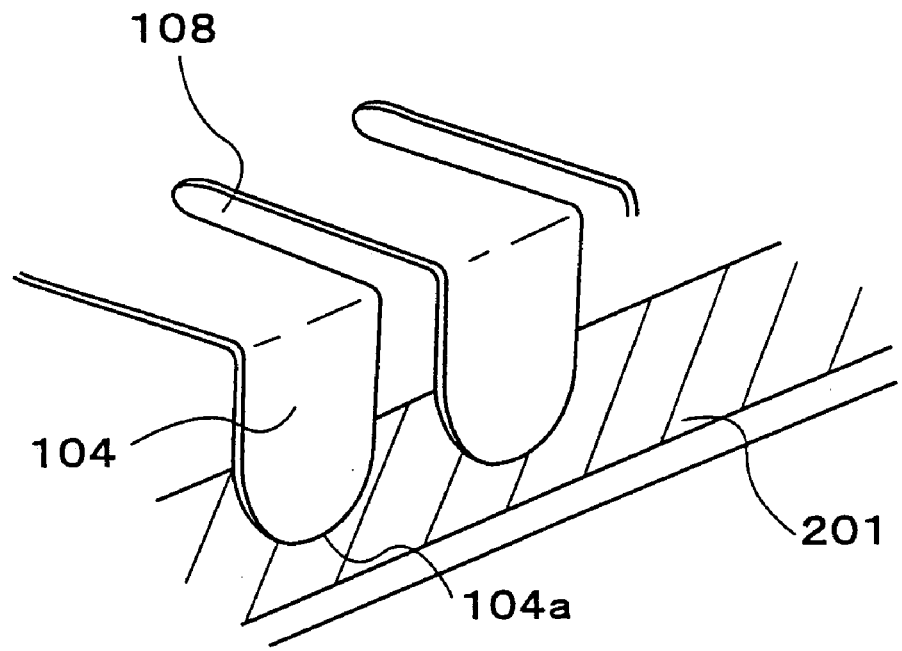
FIGS. 4A and 4B are enlarged views showing a portion where the leg portion of the electromagnetic shielding plate and a ground pattern on a printed board are in contact with respect to each other according to the first embodiment of the present invention.

When constructing the shielding structure shown in FIG. 3, the imaginary plane B is located in the same plane as the surface of the printed board 200. Since the imaginary plane A is located outside of the imaginary plane B, the tip portion 104a of the connecting strip 104 is brought into contact with the ground pattern 201 without fail. The state of contact at this time is shown in FIG. 4.

The contact pieces 104 are displaceable independently and exhibit elasticity. The elasticity ensures that the tip portions 104a and the ground pattern 201 are brought into press contact with respect to each other. For example, when the ground pattern 201 has projections and depressions, the respective connecting pieces 104 are displaced along the projections and depressions of the ground pattern 201, whereby it ensures that the tip portions 104a are brought into contact with the ground pattern 201 respectively.

Figure 4B:
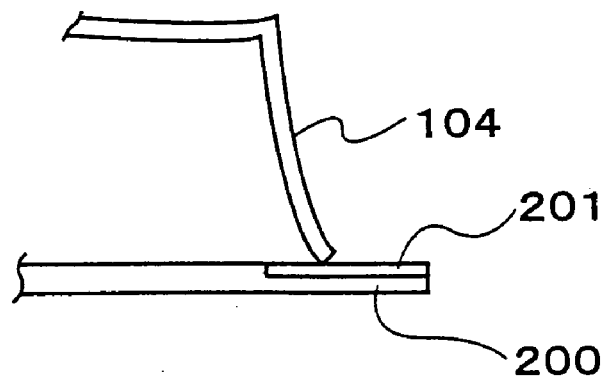

FIG. 4B shows the state where the connecting strips 104 are brought into press contact with the ground pattern 201. The elasticity of the connecting strips 104 ensures that the tip 104a of the connecting strips 104 slightly open outward so as to exhibit warped shapes. There may be flux in the shape of thin film left on the ground pattern 201. In such a case, the flux should be scrubbed away before connecting them electrically. However, as described above, when the shielding plate 100 of the present invention is fixed to the printed board 200, the connecting strips 104 open outward, thus scrubbing residual flux away accordingly. It ensures the electrical connection between the shielding plate 100 and the printed board 200. Therefore, it is not necessary to remove the flux away in advance before the shielding plate 100 of the present invention is fixed onto the printed board 200. In other words, contact between the connecting strips 104 and the ground pattern 201 is ensured without removing flux in advance.

When the cabinet, which is not shown, is placed on a cabinet-fixing portion 110, the shielding plate 100 is applied with a load, which further ensures contact between the connecting strips 104 and the ground pattern.

As described thus far, since the respective connecting strips 104 are ensured to be in contact with the ground pattern 201, a high shielding effect can be obtained.

Figure 5:
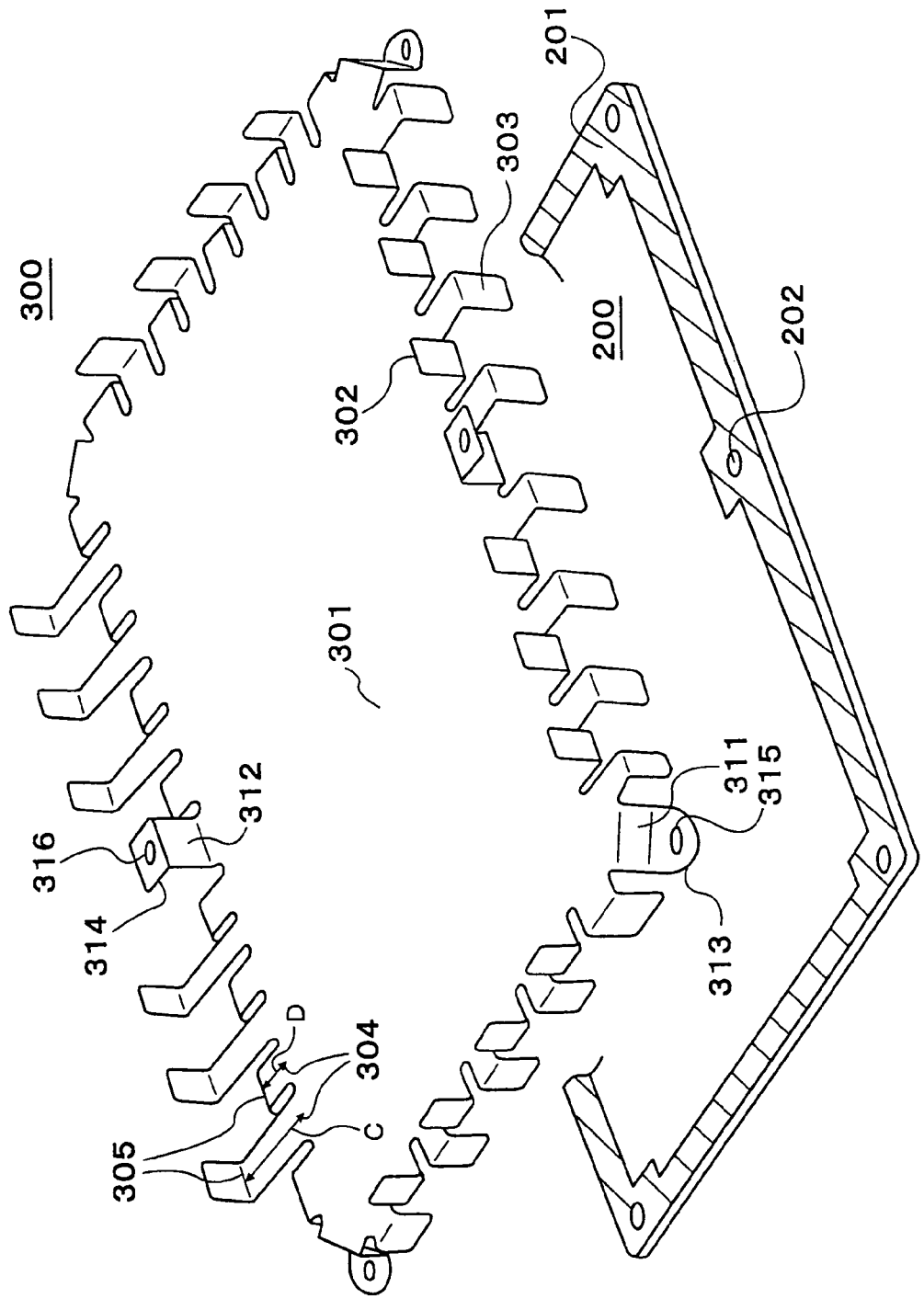
FIG. 5 is an explanatory drawing illustrating the positional relationship between an electromagnet shielding plate and a printed board according to the second embodiment of the present invention.
Figure 6A:
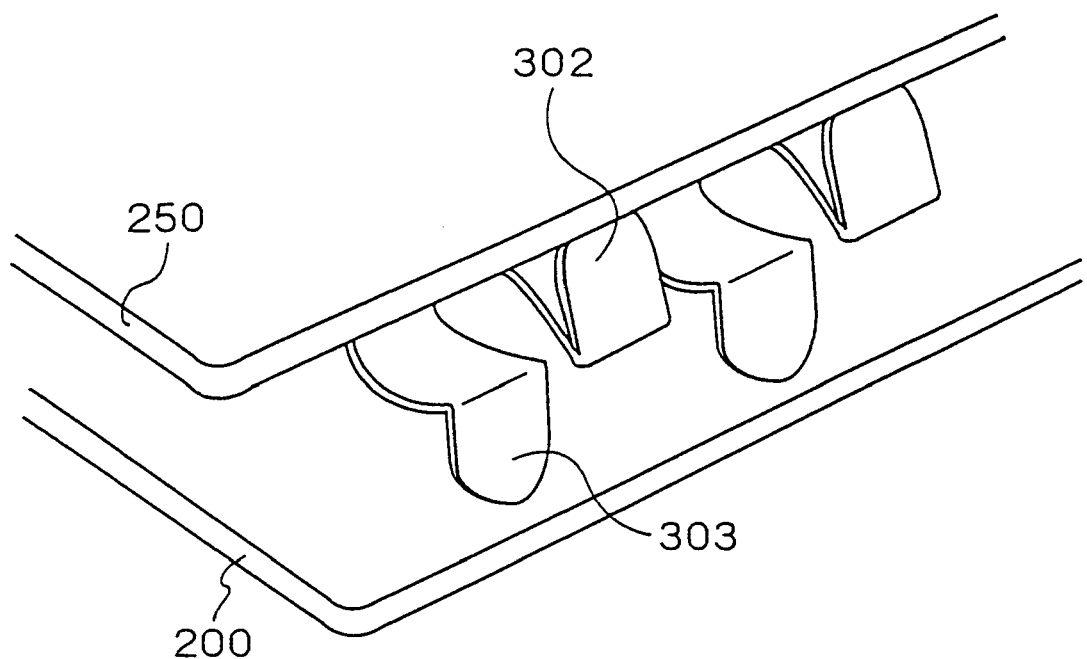
FIGS. 6A and 6B are enlarged views showing a portion where the leg portion of the electromagnetic shielding plate and a ground pattern of a printed board are in contact with respect to each other according to the second embodiment of the present invention.
Figure 6B:
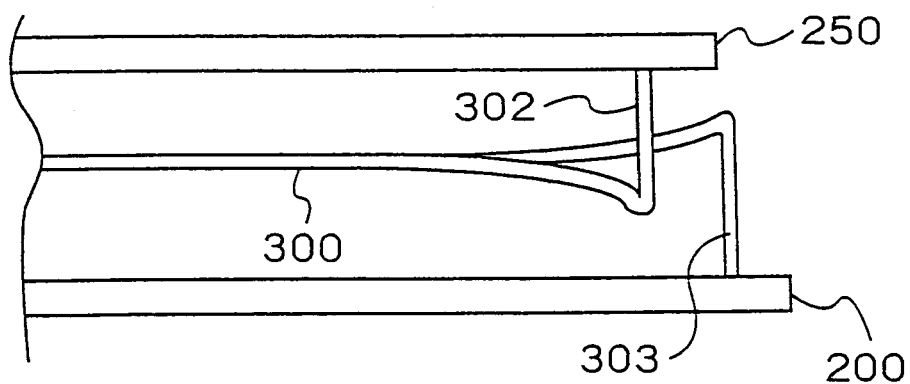

FIG. 5 and FIG. 6 show a second embodiment of a shielding structure of the present invention. The shielding structure according to the present embodiment comprises, as shown in FIG. 5 and FIG. 6, printed boards 200, 250 (the printed board 250 is not shown in FIG. 5), and a shielding plate 300. In the example shown in FIG. 5 and FIG. 6, the state where the shielding plate is mounted between two printed boards is shown.

The shielding plate 300 according to the present embodiment is formed of a conductive material having resiliency, as is the shielding plate 100 of the first embodiment. The shielding plate 300 comprises a plate portion 301, connecting strips 302, 303, and supporting portions 311, 312. The connecting strips 302, 303 are provided at a plurality of locations along the edge of the plate portion 301, as in the case of the first embodiment. The plurality of connecting strips comprises the first connecting strips 301 and the second connecting strips 303. In other words, the tips of the first connecting strips 302 are bent toward one surface of the plate portion 301. The tips of the second connecting strips 303 are bent toward another surface of the plate portion 301.

The supporting portions 311, 312 are also provided with the first supporting portion 311 and the second supporting portion 312. On the tips of the respective supporting portions 311, 312, as in the first embodiment, there are provided foot portions 313, 314. The foot portions 313, 314 are provided with the through holes 315, 316. The shielding plate 300 is fixed to the lower printed board 200 in the figure via the through hole 315, and to the upper printed board 250 in the figure via the through hole 316.

As in the first embodiment, the imaginary plane in which the tips of the connecting strips 305, 307 are aligned is located outside of the imaginary plane in which the tips of the supporting portions 311 and 312 are aligned. Therefore, when the printed boards 200 and 250 are fixed on and under the shielding plate 300, the first connecting strips 302 are brought into press contact with the ground pattern 201 of the lower printed board 200, and the second connecting strips 303 are brought into press contact with the ground pattern 251 of the upper printed board 250 respectively. FIG. 6 shows how it looks in such a state.

Since the shielding plate 300 serves to enhance the shielding effect than in the conventional case, even when two printed boards 200 and 250 are disposed one on another, electromagnetic induction generated between the two printed boards 200 and 250 may be prevented.

In this embodiment, each connecting strip is bent between its proximal end 304 and its distal end, so as to be L-shape in cross section. The overhanging length C from the proximal end 304 of the first connecting strip 302 to the bent position 305 may be set to be a different length from the overhanging length D from the proximal end 304 of the second connecting strip 303 to the bent position 305. For example, there is a case where it is preferable to displace the upper printed board 200 from the lower printed board 250 to an extent for the convenience of arrangement of substrate. In such a case, the upper printed board 250 may be displaced from the lower printed board 200 toward the farther side of the drawing by arranging the strips in such a manner that the overhanging length C of the first connecting strip 302 on the nearer side of FIG. 5 is shorter than the overhanging length D of the second connecting strips 303 on the nearer side, and the overhanging length C of the first connecting strip 302 on the farther side of the drawing is longer than the overhanging length D of the second connecting strip 303 on the farther side.

In the two embodiments described thus far, though the shielding plate is fixed onto the printed board by providing through holes onto the shielding plate and the printed board and securing them by a screw, the fixing method is not limited to this. For example, the tip of the supporting portion may be provided with a locking portion for engaging with the printed board to secure them together, or they may be secured by clips or the like. It is also possible to secure them by eliminating the supporting portion from the shielding plate but providing it with through holes only, and providing the printed board with supporting portions, so that they are secured together. Alternatively, it is possible to provide the shielding plate and the printed board with through holes, and secure them together by means of a member having an internal thread.

An entertainment system employing a shielding structure will be explained referring to a figure as the third embodiment of the present invention. In this embodiment, a structure having a shielding plate on a part of a surface of the printed board will be shown as an example.

Figure 7:
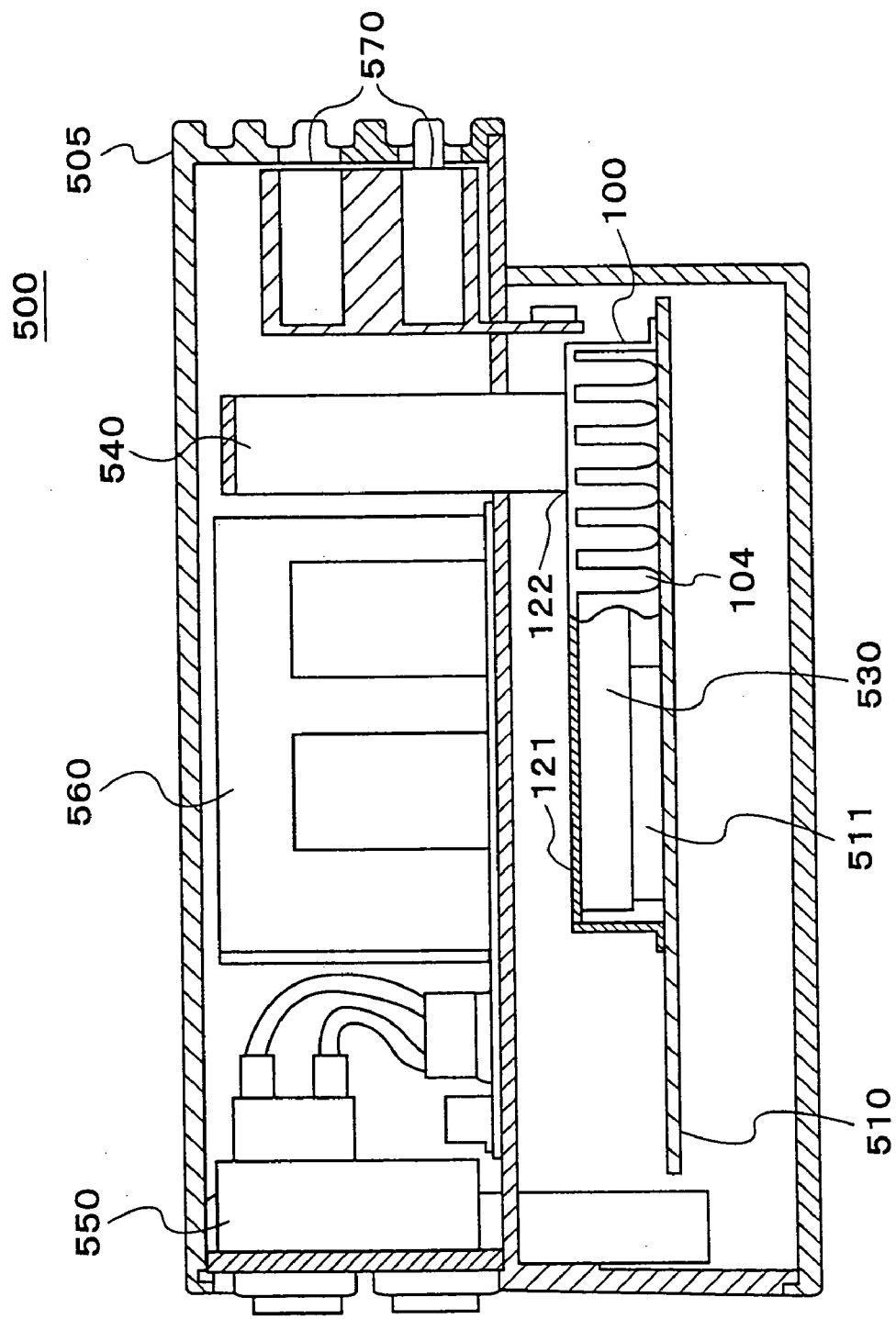
FIG. 7 is a sectional view of an entertainment system having an electromagnetic shielding plate according to the present invention.

The entertainment system 500 shown in FIG. 7 comprises at least an enclosure 505, a main control circuit substrate 510, a shielding plate 100, a pipe-shaped heat sink 530, a rectangular heat sink 540, a switch inlet unit 550, an electric power supply unit 560, and a memory card inserting portion 570. The main control circuit substrate 510 is provided with a circuit element including a central processing unit 511 mounted thereon. In this entertainment system 500, the main control circuit substrate 510 that generates the electronic wave most and the shielding plate 100 constitute the shielding structure.

A plate portion 121 of the shielding plate 100 is provided with a through hole 122, through which the rectangular heat sink 540 is inserted. The rectangular heat sink 540 constitutes a heat discharging mechanism with the pipe type heat sink 530 to prevent overheating of the central processing unit 511 in the main control circuit substrate 510.

The shielding plate 100 is connected to the main control circuit substrate 510 with the connecting strips 104 in press contact with the ground pattern to shield electromagnetic waves generated by the main control circuit substrate 510.

According to the present invention, there is provided the shielding plate that can be mounted easily without adding any special mounting steps, and can prevent electromagnetic radiation independently of the state of the object to which the shielding plate is mounted.

In addition, according to the present invention, there is provided a shielding structure having a smaller range of product-to product variations in shielding performance, and an entertainment system that can prevent the electromagnetic waves from being radiated by the use of such a shielding structure.

What is claimed is:

1. An electromagnetic shielding plate for shielding electromagnetic radiation by covering at least a part of an object comprising:
   a conductive covering plate having an edge and a plate surface;
   a plurality of conductive connecting strips provided along the edge of said covering plate, said connecting strips extending along said plate surface and downwardly from said edge and terminating in tip portions that conduct electromagnetic radiation from said conductive covering plate to a ground of said object;

wherein each of said connecting strips has a front surface and a back surface in a shape of a plate, and an edge of the front surface and an edge of the back surface in said tip portion side are formed in a shape of an arc in approximate point contact with said ground.

2. An electromagnetic shielding plate according to claim 1, further comprising a supporting portion for establishing a space of a predetermined width between said conductive covering plate and said object, and said supporting portion being the same height as the predetermined width from said conductive covering plate, wherein a height of said connecting strips from said conductive covering plate to said tip portions is higher than a height of said supporting portion.

3. An electromagnetic shielding plate according to claim 2, wherein said supporting portion comprises a connecting portion for connecting said electromagnetic shielding plate with said object.

4. An electromagnetic shielding plate according to claim 3, wherein said covering plate and said connecting strip are integrally formed.

5. An electromagnetic shielding plate according to claim 2, wherein respective gaps between the plurality of connecting strips are smaller than said predetermined width.

6. An electromagnetic shielding plate according to claim 1, wherein said conductive covering plate includes a cabinet-fixing portion for securing a cabinet to said plate surface.

7. An electromagnetic shielding plate according to claim 1, wherein said plurality of connecting strips includes a first group of connecting strips, the tips of which are bent in a first direction relative to said plate surface, and a second group of connecting strips, the tips of which are bent in a second direction relative to said plate surface and opposite of said first direction.

8. An electromagnetic shielding plate according to claim 7, wherein said covering plate is provided with a first supporting portion extending in said first direction and a second supporting portion extending in said second direction for establishing a space between said electromagnetic shielding plate and a first and a second object positioned in said first and second directions relative to said electromagnetic shielding plate.

9. An electromagnetic shielding plate according to claim 8, wherein said first and second supporting portions each comprise a connecting portion for connecting said electromagnetic shielding plate with said first and second objects.

10. An electromagnetic shielding plate according to claim 9, wherein said connecting strips project a greater distance away from said covering plate than said supporting portions.

11. An electromagnetic shielding plate according to claim 10, wherein said covering plate and said connecting strips are integrally formed.

12. An electromagnetic shielding plate according to claim 8, wherein said connecting strips project a greater distance away from said covering plate than said supporting portions.

13. An electromagnetic shielding plate for shielding electromagnetic radiation by covering at least a part of an object the electromagnetic shielding plate comprising:
    a conductive box-shaped structure having a plate portion and a side surface portion provided around the plate portion and formed integrally therewith, the plate portion and the side surface portion lying in transverse planes relative to each other and forming a first edge, the side surface portion having a second edge distal from the first edge, the side surface portion and the second edge lying in transverse planes relative to each other;
    a plurality of spaced-apart notches formed in the plate portion and the side surface portion and defining a plurality of projections being provided at a plurality of locations along the first edge of the side surface portion, each of the plurality of projections comprising a first portion extending in the plane of the plate surface and a second portion extending in the plane of the side surface portion, the second portion terminating at the second edge,
    wherein at least one of the plurality of projections terminates in a tip portion that conducts electromagnetic radiation from the conductive covering plate to ground of the object, the second portion of each of the plurality of projections having a tip shape and being dimensioned to press against the at least part of the object upon covering the at least part of the object of the conductive covering plate, and
    at least one of the plurality of projections forming a supporting portion disposed at the second edge for establishing a space of a predetermined width between the conductive plate portion and the object, and plurality of remaining projections out of the plurality of projections forming connecting portions.

14. An electromagnetic shielding plate according to claim 13, wherein said supporting portion is the same height as the predetermined width from said conducting covering plate, and a height of said connecting strips from said conductive covering plate to said tip portion is higher than a height of said supporting portion.

15. An electromagnetic shielding plate according to claim 13, wherein said plate surface of the conductive covering plate has a portion for bearing load.

16. An electromagnetic shielding structure comprising:
    an object including a circuit element mounted thereon; and
    an electromagnetic shielding plate for shielding electromagnetic radiation by covering at least a part of the object;
    the object comprising a band-shaped ground pattern surrounding an area on which electromagnetic shielding is to be provided on a surface where said circuit element is mounted;
    wherein the electromagnetic shielding plate comprises
        a conductive covering plate having an edge and a plate surface, the edge and the plate surface lying in transverse planes,
        a plurality of spaced-apart notches formed in the conductive covering plate and defining a plurality of conductive connecting strips, each of the connecting strips comprising a first portion extending in the plane of the plate surface and a second portion extending in the plane of the edge, the second portion terminating in a tip portion that conducts electromagnetic radiation from the conductive covering plate to ground of the object, the second portion of each of the plurality of conductive strips having a tip shape and being dimensioned to press against the at least part of the object upon covering the at least part of the object of the conductive covering plate.

17. An electromagnetic shielding structure according to claim 16, further comprising a supporting portion for establishing a space between said electromagnetic shielding plate and said object,
    wherein said supporting portion is the same height as the predetermined width from said electromagnetic shielding plate, wherein a height of said connecting strips from said electromagnetic shielding plate to said tip portions is higher than a height of said supporting portion; and wherein said supporting portion of said electromagnetic shielding plate is secured to said object, and said conductive covering and said object are kept in a positional relationship such that the tip portion of said connecting strips of said electromagnetic shielding plate are elastically deformed and are in press contact with said ground pattern.

18. An electromagnetic shielding structure according to claim 17, wherein said supporting portion comprises a connecting portion for connecting said electromagnetic shielding plate with said object.

19. An electromagnetic shielding structure according to claim 17, wherein respective gaps between the plurality of said connecting strips are small than said predetermined width.

20. An electromagnetic shielding structure according to claim 16, said electromagnetic shielding plate includes a cabinet-fixing portion for securing a cabinet to said shielding plate.

21. An electromagnetic shielding plate according to claim 16, wherein said plate surface of the conductive covering plate has a portion for bearing load.

22. An entertainment system comprising:
a main control circuit substrate including a circuit element mounted thereon;
an electromagnetic shielding plate for shielding electromagnetic radiation by covering at least a part of the main control circuit substrate; and
an electric power supply unit;
the main control circuit substrate comprising a band-shaped ground pattern enclosing an area on which electromagnetic shielding is to be provided on a surface where the circuit element is mounted;
wherein the electromagnetic shielding a plate comprises
a conductive covering plate having an edge and a plate surface, the edge and the plate surface lying in transverse planes,
a plurality of spaced-apart notches formed in the conductive covering plate and defining a plurality of conductive connecting strips, each of the connecting strips comprising a first portion extending in the plane of the plate surface and a second portion extending in the plane of the edge, the second portion terminating in a tip portion that conducts electromagnetic radiation from the conductive covering plate to ground of the object, the second portion of each of the plurality of conductive strips having a tip shape and being dimensioned to press against the at least part of the object upon covering the at least part of the object of the conductive covering plate.

23. An entertainment system according to claim 22, further comprising a supporting portion for establishing a space between said covering plate and said object,
wherein said supporting portion is the same height as the predetermined width from said covering plate,
wherein a height of said connecting strips from said conductive covering plate to said tip portions is higher than a height of said supporting portion; and
wherein said supporting portion of said electromagnetic shielding plate is secured to said main control circuit substrate, and said electromagnetic shielding plate and said main control circuit substrate are kept in a positional relationship such that the tip portion of said connecting strips of said electromagnetic shielding plate are elastically deformed and are in press contact with said ground pattern.

24. An entertainment system according to claim 23, wherein the respective gaps between the plurality of said connecting strips are smaller than said predetermined width.

25. An electromagnetic shielding plate according to claim 22, wherein said plate surface of the conductive covering plate has portion for bearing load.

26. An electromagnetic shielding plate for shielding electromagnetic radiation by covering at least a part of an object, the electromagnetic shielding plate comprising:
a conductive covering plate having an edge and a plate surface, the edge and the plate surface lying in transverse planes;
a plurality of spaced-apart notches formed in the conductive covering plate and defining a plurality of conductive connecting strips, each of the connecting strips comprising a first portion extending in the plane of the plate surface and a second portion extending in the plane of the edge, the second portion terminating in a tip portion that conducts electromagnetic radiation from the conductive covering plate to a ground of the object; the second portion of each of the plurality of conductive strips having a tip shaped and dimensioned to press against the at least part of object upon covering the at least part of object of the conductive covering plate.

27. An electromagnetic shielding plate according to claim 26, wherein said plate surface of the conductive covering plate has a portion for bearing load.

28. An electromagnetic shielding plate according to claim 26, further comprising a supporting portion for establishing a space of a predetermined width between said conductive covering plate and said object, and said supporting portion being the same height as the predetermined width from said conductive covering plate, wherein a height of said connecting strips from said conductive covering plate to said tip portions is higher than a height of said supporting portion.

29. An electromagnetic shielding plate for shielding electromagnetic radiation by covering at least a part of an object comprising:
a conductive covering plate having an edge and a plate surface;
a plurality of conductive connecting strips provided along the edge of said covering plate, said connecting strips extending along said plate surface and downwardly from said edge and terminating in tip portions that conduct electromagnetic radiation from said conductive covering plate to a ground of said object;
wherein each of said connecting strips has a front surface and a back surface in a shape of a plate, and an edge of the front surface and an edge of the back surface in said tip portion side are formed in a shape of an arc in approximate point contact with said ground, said tip portion being adapted to remove flux disposed on the ground by the point contact.

* * * * *